United States Patent
Nagata

(10) Patent No.: US 11,309,851 B2
(45) Date of Patent: Apr. 19, 2022

(54) POWER SUPPLY CIRCUITRY AND RADIO COMMUNICATION APPARATUS

(71) Applicants: Kabushiki Kaisha Toshiba, Tokyo (JP); Toshiba Electronic Devices & Storage Corporation, Tokyo (JP)

(72) Inventor: Minoru Nagata, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 214 days.

(21) Appl. No.: 16/791,053

(22) Filed: Feb. 14, 2020

(65) Prior Publication Data
US 2021/0075378 A1    Mar. 11, 2021

(30) Foreign Application Priority Data
Sep. 6, 2019    (JP) .............................. JP2019-162636

(51) Int. Cl.
| | | |
|---|---|---|
| H03F 1/30 | (2006.01) | |
| H03F 3/193 | (2006.01) | |
| H03F 1/02 | (2006.01) | |
| G05F 3/26 | (2006.01) | |
| H03F 3/24 | (2006.01) | |
| H03F 3/45 | (2006.01) | |
| H04B 1/04 | (2006.01) | |

(52) U.S. Cl.
CPC ............ *H03F 3/193* (2013.01); *G05F 3/262* (2013.01); *H03F 1/0222* (2013.01); *H03F 3/24* (2013.01); *H03F 3/45475* (2013.01); *H04B 1/0483* (2013.01)

(58) Field of Classification Search
CPC ...................................................... H03F 1/30
USPC ........................................ 330/297, 296, 285
See application file for complete search history.

(56) References Cited

U.S. PATENT DOCUMENTS

| | | | |
|---|---|---|---|
| 5,736,879 A * | 4/1998 | Pham ....................... | H03K 9/06 327/102 |
| 6,785,521 B2 | 8/2004 | Hadjichristos et al. | |
| 7,202,743 B2 | 4/2007 | Enomoto | |
| 7,671,684 B2 | 3/2010 | Honda et al. | |
| 7,948,321 B2 | 5/2011 | Honda et al. | |
| 8,729,876 B2 | 5/2014 | Shen | |
| 10,014,772 B2 * | 7/2018 | Sneep ..................... | G05F 1/575 |
| 2011/0181259 A1 | 7/2011 | Shen | |

(Continued)

FOREIGN PATENT DOCUMENTS

| | | |
|---|---|---|
| JP | 2005-217997 A | 8/2005 |
| JP | 2007-19631 A | 1/2007 |
| JP | 2008-506337 A | 2/2008 |

(Continued)

*Primary Examiner* — Henry Choe
(74) *Attorney, Agent, or Firm* — Allen & Overy LLP

(57) ABSTRACT

A power supply circuitry includes a first circuitry, a second circuitry, a fourth circuitry, and a fifth circuitry. The first circuitry outputs a first current based on a drive signal. The second circuitry generates a second current according to the first current. The fourth circuitry generates the drive signal based on a first voltage according to the first current. The fifth circuitry outputs a second voltage based on the first current and on the second current.

18 Claims, 6 Drawing Sheets

(56) References Cited

U.S. PATENT DOCUMENTS

2012/0025913 A1* 2/2012 Honda ............... H03F 3/45183
330/291

FOREIGN PATENT DOCUMENTS

| JP | 4102815 B2 | 6/2008 |
| JP | 4646981 B2 | 3/2011 |
| TW | 201126300 A1 | 8/2011 |

* cited by examiner

POWER SUPPLY CIRCUITRY AND RADIO COMMUNICATION APPARATUS

CROSS REFERENCE TO RELATED APPLICATIONS

This application is based upon and claims the benefit of priority from the prior Japanese Patent Application No. 2019-162636, filed on Sep. 6, 2019, the entire contents of which are incorporated herein by reference.

FIELD

The embodiments of the present invention relate to a power supply circuitry and a radio communication apparatus.

BACKGROUND

A bias circuitry which sets the current flowing through an LNA (Low Noise Amplifier) is provided with a transistor having a gate coupled in common with a gate of a transistor into which an RF signal is input, to constitute a current mirror between the transistor and a reference current source. However, as the transistor used in the LNA, a transistor having a short gate length is often used to obtain an excellent high-frequency characteristic. Therefore, when constituting the current mirror, the transistor has a problem of poor pair performance and wide variation in current.

DETAILED DESCRIPTION

Figure 1:
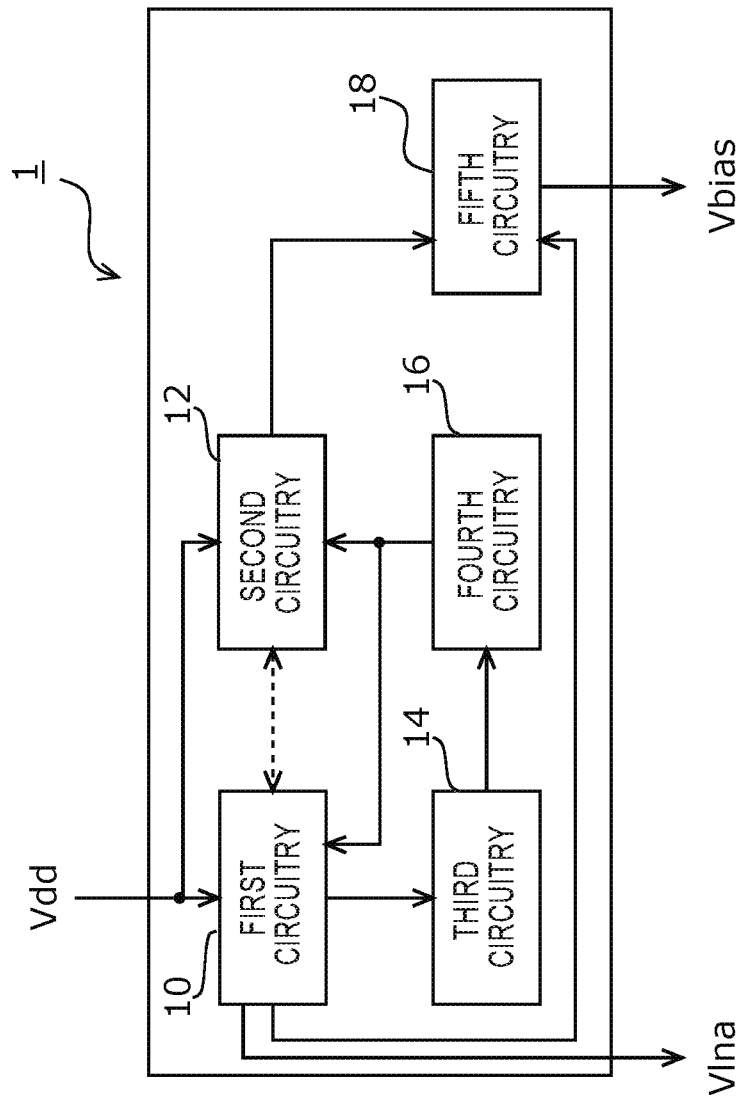
FIG. 1 is a schematic diagram of a power supply circuitry according to an embodiment.

According to some embodiments, a power supply circuitry includes a first circuitry, a second circuitry, a fourth circuitry, and a fifth circuitry. The first circuitry outputs a first current based on a drive signal. The second circuitry generates a second current according to the first current. The fourth circuitry generates the drive signal based on a first voltage according to the first current. The fifth circuitry outputs a second voltage based on the first current and on the second current.

Hereinafter the embodiments are explained referring to the drawings.

FIG. 1 is a schematic diagram of a power supply circuitry 1 according to an embodiment. The power supply circuitry 1 includes a first circuitry 10, a second circuitry 12, a third circuitry 14, a fourth circuitry 16, and a fifth circuitry 18. The power supply circuitry 1 outputs, for example, a power supply voltage Vlna (first voltage) for an LNA and a bias voltage Vbias (second voltage) for an input RF (Radio Frequency) signal. The power supply circuitry 1 is, for example, a linear regulator, more specifically, an LDO (Low Dropout) power supply.

The first circuitry 10 includes a switching element and, when a drive signal is input thereto, generates a first current I1 from a power supply voltage Vdd of the power supply circuitry 1 and outputs the first current I1. The power supply circuitry 1 forms a voltage (for example, a potential difference from a ground surface) by the first current I1 and a resistance value of the later-explained third circuitry 14, and outputs the voltage as the power supply voltage Vlna (first voltage) for the LNA.

The second circuitry 12 includes a switching element and, when a drive signal is input thereto, generates a second current I2 proportional to the first current I1 from the power supply voltage Vdd and outputs the second current I2.

The third circuitry 14 includes an impedance capable of generating the power supply voltage Vna by the first current I1 output from the first circuitry 10. When a load is coupled outside to the current output from the first circuitry 10 and a load current flows, the third circuitry 14 generates a feedback voltage Vfb for feeding back a voltage based on a difference between the first current I1 and a load current Iload in order to control a drive signal.

The fourth circuitry 16 controls drive signals for the first circuitry 10 and the second circuitry 12 based on the feedback voltage Vfb and on a reference voltage Vref.

The reference voltage Vref is set so that the first circuitry 10 outputs a predetermined current, for example, in a steady state, namely, a state where the power supply circuitry 1 outputs a predetermined voltage as Vlna. The predetermined current is defined so that the current flowing through the second circuitry 12 becomes a reference current Iref. For example, the reference voltage Vref is set so that when the ratio between the output current from the first circuitry 10 and the output current from the second circuitry 12 is 80:1, a current of 80×Iref flows from the first circuitry 10.

The fifth circuitry 18 outputs a bias voltage Vbias (second voltage) based on the voltage generated by the third circuitry by a value obtained by subtracting the load current Iload from the first current I1 and the voltage generated by a value obtained by subtracting the reference current Iref from the second current I2.

Figure 2:
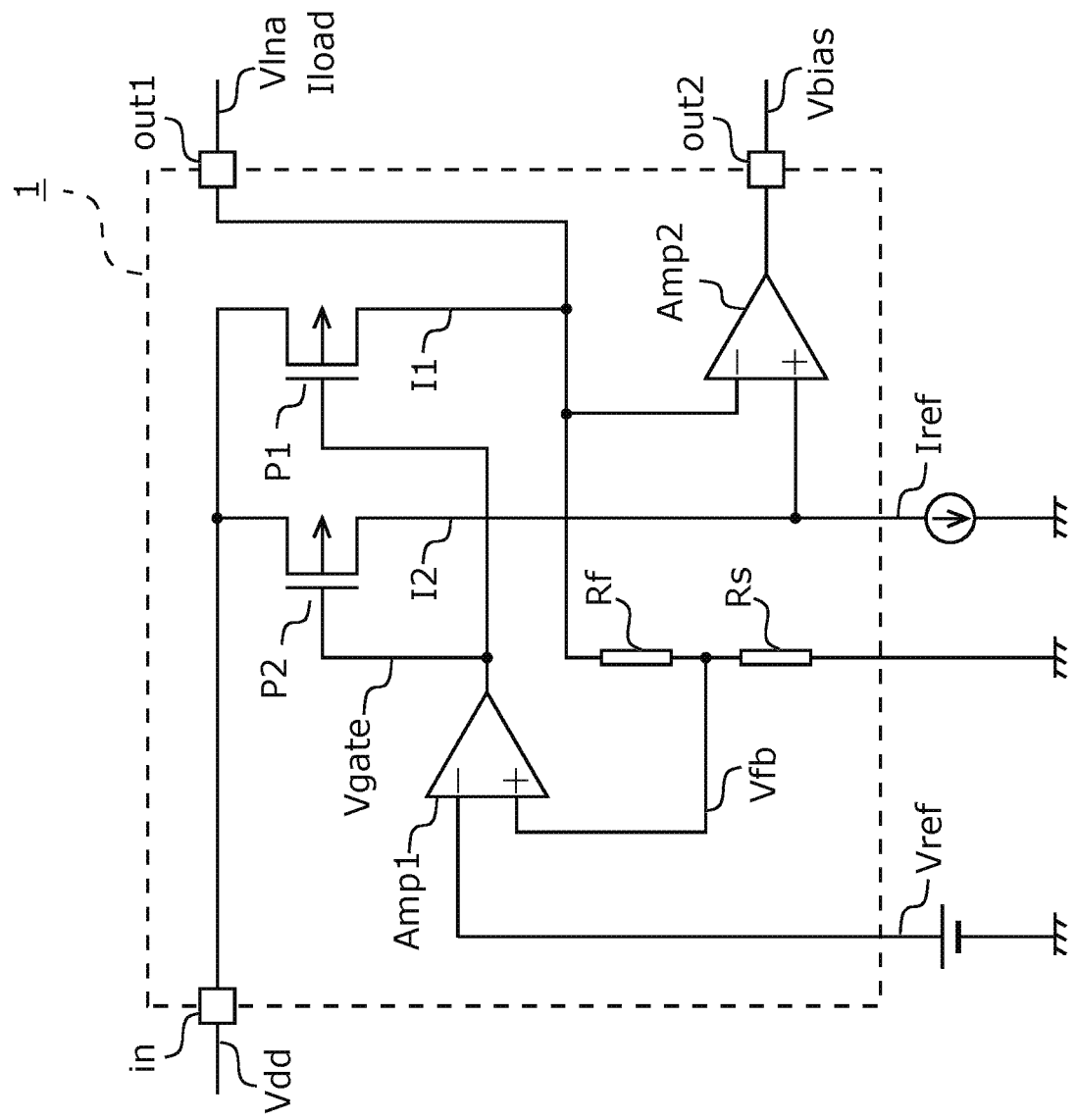
FIG. 2 is a circuitry diagram relating to an example of the power supply circuitry according to an embodiment.

FIG. 2 is a diagram illustrating an example of implementation of the power supply circuitry 1 according to an embodiment. The power supply circuitry 1 includes a first transistor P1 as the first circuitry, a second transistor P2 as the second circuitry, resistances Rf, Rs as the third circuitry, a first differential amplifier Amp1 as the fourth circuitry, and a second amplifier Amp2 as the fifth circuitry.

The power supply circuitry 1 includes an input terminal in, and output terminals out1, out2. The input terminal in is a terminal into which the power supply voltage Vdd on the positive side is input. Though a ground surface is illustrated in FIG. 2, a ground terminal may be provided as a power supply voltage on a negative side pairing up with the input terminal in. Further, instead of grounding, an input terminal to which a negative voltage corresponding to Vdd is applied may be provided.

The output terminal out1 outputs the power supply voltage Vna to be output to the outside. As the external load, for example, an LNA is connected. The output terminal out2 outputs the bias voltage Vbias of the input of the Rf signal for the LNA.

The first transistor P1 is, for example, a p-type MOSFET (Metal-Oxide-Semiconductor Field Effect Transistor) and has a source coupled to the input terminal in, a gate coupled to the first differential amplifier Amp1, and a drain coupled to the output terminal out1. In the first transistor P1, the power supply voltage Vdd is applied to the source and a drive voltage Vgate is applied to the gate. The drive voltage Vgate applied to the gate controls the first current I1 to be output from the drain.

The second transistor P2 is, for example, a p-type MOSFET, and has a source coupled to the input terminal in, a gate coupled to an output of the first differential amplifier Amp1, and drain through which a constant current flows. In the second transistor P2, the power supply voltage Vdd is applied to the source, and the drive voltage Vgate is applied to the gate. The drive voltage Vgate applied to the gate controls the second current I2 to be output from the drain.

The second transistor P2 may have the gate coupled in common with the gate of the first transistor P1 to form a current mirror. In this case, the ratio between the drain currents of the first transistor P1 and the second transistor P2 can be arbitrarily set, and can be designed depending on various situations such as a use application, external load and so on.

Further, the drain of the second transistor P2 is coupled to a reference current source, and the reference current Iref flows from the drain. The reference current Iref is coupled to the drain as explained above, so that the second transistor operates as an amplifier which amplifies the drive voltage Vgate applied to the gate and outputs the obtained voltage.

As explained above, the second transistor P2 operates as the current mirror which outputs a current proportional to the first transistor P1, and as an amplifier which multiplies the drive voltage Vgate applied to the gate by a gain and outputs the obtained voltage. More specifically, the second transistor P2 operates as an amplifier which multiplies the voltage on the drain side of the first transistor P1 by a gain and outputs the obtained voltage.

The resistance Rf has one terminal coupled to the drain of the first transistor P1 and another terminal grounded via the resistance Rs. The current from the drain of the first transistor P1 in the steady state flows through a combined resistance of the resistances Rf, Rs to generate the power supply voltage Vlna to be output to the external load. These resistances output the feedback voltage Vfb as Vlan×Rs/(Rs+Rf).

The first differential amplifier Amp1 has a non-inverting input coupled to a node between the resistances Rf and Rs (the other terminal of the resistance Rf), an inverting input to which the reference voltage Vref is applied, and an output coupled to the gate of the first transistor P1 and to the gate of the second transistor P2. The first differential amplifier Amp1 compares the feedback voltage Vfb with the reference voltage Vref, amplifies a difference between these voltages, and outputs the obtained voltage as the drive voltage Vgate.

The second differential amplifier Amp2 has a non-inverting input coupled to the drain of the second transistor P2, an inverting input coupled to the drain of the first transistor P1, and an output coupled to the output terminal out2. The second differential amplifier Amp2 amplifies a potential difference between the drain of the second transistor P2 and the drain of the first transistor P1, and outputs the bias voltage Vbias via the output terminal out2.

The whole operation is explained.

In a state where the load is not coupled, when the power supply voltage Vdd is coupled to the input terminal in, a voltage proportional to −Vref is applied to the gates to turn on the first transistor P1 and the second transistor P2, thereby outputting the first current I1 and the second current I2 from the drains. Here, Vref is assumed to be larger than the absolute values of threshold voltages of the transistors.

The potential of the drain of the first transistor P1 is defined by the first current I1 being the drain current of the first transistor P1, based on the resistances Rf, Rs. The resistances Rf, Rs input a voltage that is Rs/(Rs+Rf) times the voltage of the drain, as the feedback voltage Vfb, into the non-inverting input of the first differential amplifier Amp1.

The first differential amplifier Amp1 applies the drive voltage Vgate obtained by amplifying the difference between the feedback voltage Vfb and the reference voltage Vref to the gates of the first transistor P1 and the second transistor P2. The value of Vgate becomes larger by the feedback voltage Vfb, so that the drain currents of the first transistor P1 and the second transistor P2 decrease.

This operation continues until the voltage of the first transistor P1 converges to the set power supply voltage Vlna to the outside, and the voltage output from the first transistor P1 finally becomes the power supply voltage Vlna, leading to the steady state. Further, in the steady state, the difference between the drain potential of the first transistor P1 and the drain potential of the second transistor P2 is amplified, so that the voltage of the outer terminal of the second differential amplifier Amp2 becomes the bias voltage Vbias.

In the steady state, the circuitry elements are set so as to obtain a desired power supply voltage Vna and a desired bias voltage Vbias. Further, in this steady state, the reference voltage Vref is set so that the drain current of the second transistor P2 becomes the reference current Iref. Further, the reference voltage Vref and the reference current Iref may be set in advance, and the values of the elements may be decided to create a state where when the power supply voltage Vdd is input in the steady state, the power supply voltage Vna is applied to the output terminal out1 and the bias voltage Vbias is applied to the output terminal out2.

Next, a state where the load, for example, the LNA is coupled to the output terminals out1, out2 is considered.

Figure 3:
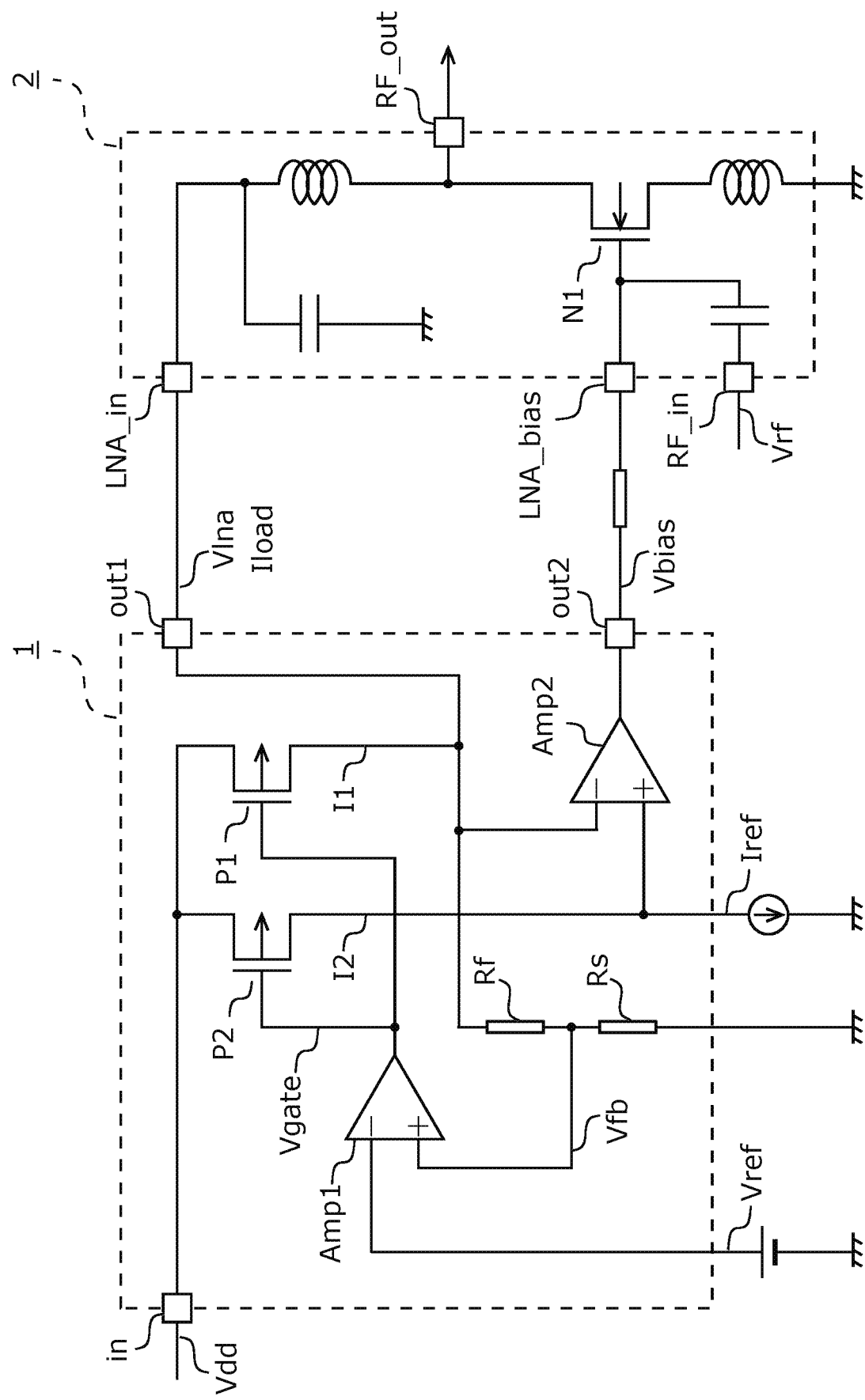
FIG. 3 is a circuitry diagram illustrating a coupling example of the power supply circuitry according to an embodiment.

FIG. 3 is a diagram illustrating an example where an LNA 2 is coupled to the power supply circuitry 1. The LNA 2 illustrated is a simple one as one example, and may have a further complex configuration. For example, the LNA 2 may be nMOSFETs cascaded at a plurality of stages, and does not limit this embodiment in any case.

The output terminal out1 of the power supply circuitry 1 is coupled to a power supply input terminal LAN_in of the LNA 2, and the output terminal out2 of the power supply circuitry 1 is coupled to a bias terminal LAN_bias as the bias input of the LNA 2 via a resistance so that the RF signal is not transmitted to the power supply circuitry 1. To an RF signal input terminal RF_in of the LNA 2, Vrf being an input signal is input. The input signal Vrf is biased by Vbias and then applied to a gate of a transistor N1. The transistor N1 multiplies the input signal Vrf by a gain and outputs the obtained signal from an output terminal RF_out.

When the LNA 2 into which no RF signal is input is coupled to the power supply circuitry 1, the load current Iload flows from the output terminal out1. The load current Iload decreases the voltage to be generated by the resistances Rf, Rs. This causes a decrease in voltage to be output from the output terminal out1 of the power supply circuitry 1.

The decrease in the feedback voltage Vfb further decreases the voltage to be output from the first differential amplifier Amp1 to increase the drain current of the first transistor P1. Similarly, the drive voltage Vgate applied to the gate of the second transistor P2 decreases to increase the drain current of the second transistor P2.

As a result of this, when the drain voltage of the first transistor P1 temporarily decreases, the drain voltage of the second transistor P2 increases, so that a voltage higher than that in the steady state is output from the second differential amplifier Amp2 until the drain voltage of the first transistor P1 returns to the steady state. Then, as in the above-explained operation, after a lapse of a time-constant sufficient time, the voltage reaches the steady state.

As explained above, when the load current Iload increases, the bias voltage Vbias increases to increase the drain current of the transistor N1.

Conversely, when the load current Iload decreases from the steady state, the drain voltage of the first transistor P1 increases. When the drain voltage of the first transistor P1 increases, the feedback voltage Vfb accordingly increases to increase the drive voltage Vgate to be applied to the gate of the first transistor P1 and the gate of the second transistor P2. Since the drive voltage Vgate increases, the drain current I1 of the first transistor P1 and the drain current I2 of the second transistor P2 decrease.

As a result of this, when the drain voltage of the first transistor P1 temporarily increases, the drain voltage of the second transistor P2 decreases, so that a voltage lower than that in the steady state is output from the second differential amplifier Amp2 until the drain voltage of the first transistor P1 returns to the steady state. Then, as in the above-explained operation, after a lapse of a time-constant sufficient time, the voltage reaches the steady state.

As explained above, when the load current Iload decreases, the bias voltage Vbias decreases to decrease the drain current of the transistor N1. Note that setting is made such that the bias voltage Vbias is output to exceed the absolute value of the minimum value of the input RF signal is output even when the bias voltage Vbias decreases, thereby enabling avoidance of deterioration of the RF signal.

When the load current Iload increases/decreases as explained above, the bias voltage Vbias is controlled to be high/low to increase/decrease the drain current of the transistor N1 in the LNA 2 into which the RF signal is input. In other words, the power supply circuitry 1, in particular, the first transistor P1 monitors the load current Iload flowing through the LNA 2, and controls the bias voltage Vbias so that the current according to the load current Iload flows through the transistor N1.

As explained above, according to this embodiment, the bias voltage to be applied to the LNA can be controlled based on the load current flowing through the LNA itself. The monitoring of the load current flowing through the LNA itself is executed in the first transistor P1 which outputs the power supply voltage of the power supply circuitry 1. However, the first transistor P1 and the transistor N1 of the LNA do not have gates coupled in common, so that the gate of the first transistor P1 does not need to be designed suitable for a high frequency, and therefore it is possible to make its gate length longer than that of the transistor used for reception of the high-frequency signal.

As explained above, the transistor relating to the output used in the power supply circuitry 1 does not need to be designed for the high-frequency signal, such as decreasing the gate length, so that an excellent pair performance with the transistor into which the RF signal of the LNA is input can be ensured, and the transistor which outputs the bias voltage can also be made to stably operate. Therefore, it becomes possible to output the bias voltage with less variation in the current of the LNA.

Further, according to the power supply circuitry 1 according to this embodiment, it is possible to output a suitable bias voltage by securing a constant current source which flows a predetermined current. This enables trimming the circuitry which outputs the bias voltage and reduction of the footprint of the circuitry for current regulation or the like, thereby enabling more flexible circuitry design.

Note that in FIG. 2 and FIG. 3, the reference current source and the reference voltage source are provided outside the power supply circuitry 1, but may be provided inside the power supply circuitry 1. Further, though not illustrated, the power supply voltage Vdd may be coupled to a suitable part requiring the power supply voltage, for example, the first differential amplifier Amp1. These diagrams draw the parts being the essential points of this embodiment, but do not reject the additional provision of other appropriate circuitry elements such as a resistance, a capacitor, a diode and so on.

Figure 4:
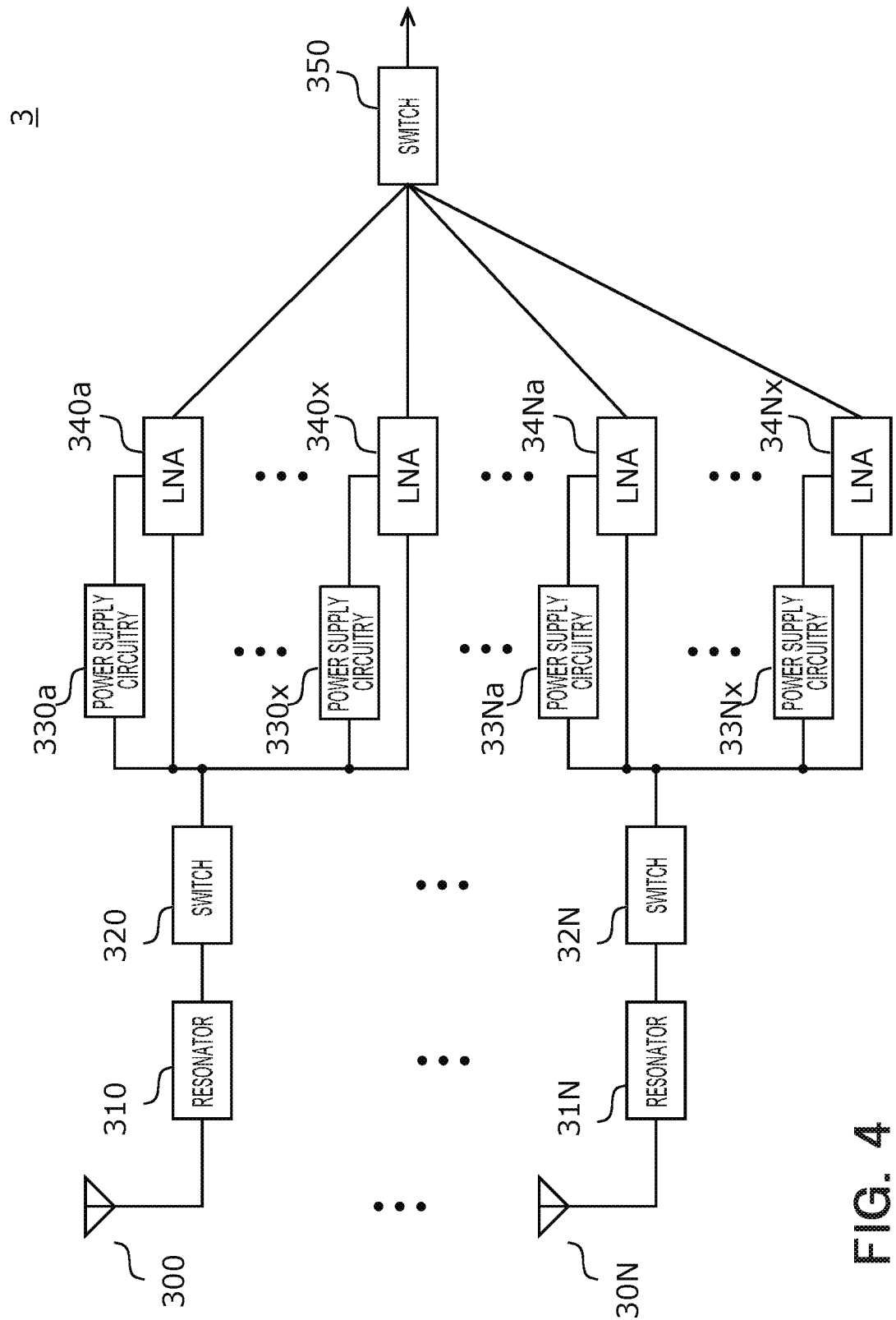
FIG. 4 is a diagram illustrating a mounting example of the power supply circuitry according to an embodiment.

FIG. 4 is a diagram illustrating a mounting example of the power supply circuitry 1 according to this embodiment. The power supply circuitry 1 and the LNA 2 are mounted on a radio communication apparatus 3.

The radio communication apparatus 3 includes antennas 300, . . . , 30N, resonators 310, . . . , 31N, input-side switches 320, . . . , 32N, power supply circuitries 330a, . . . , 330x, and 33Na, . . . , 33Nx, and LNAs 340a, . . . , 340x, and 34Na, . . . , 34Nx, and an output-side switch 350. FIG. 4 draws the function on the reception side of the radio communication apparatus 3, but does not exclude functions other than that.

The radio communication apparatus 3 receives signals in a plurality of frequency bands by the plurality of antennas 300, . . . , 30N. The signals are, for example, RF signals.

The plurality of antennas 300, . . . , 30N receive, for example, the signals in the frequency bands corresponding to the respective antennas. The plurality of antennas 300, . . . , 30N do not reject reception of the same frequency included in different frequency bands. For example, antennas which receive the radiowaves in frequency bands of Band 7 (2620-2690 MHz) and Band 41 (2496-2690 MHz) may be provided respectively.

The resonators 310, . . . , 31N remove noise of the signals received by the corresponding antennas, and may amplify the signals. The resonator 310 is not essential but may be omitted depending on the quality of the signal.

The input-side switch 320 is coupled so as to more finely classify the radio wave included in each frequency band, select an appropriate LNA, and make the received signal output to the selected LNA. Further, an enable signal may be additionally transmitted to the power supply circuitry so as to activate the power supply circuitry corresponding to the selected LNA.

Each of the power supply circuitries 330a, . . . , 330x includes the power supply circuitry 1 in the above-explained embodiment. Each of the LNAs 340a, . . . , 340x includes the LNA 2 in the above-explained embodiment.

The LNA selected by the input-side switch is activated to receive the signal of an appropriate frequency. The power supply circuitry is designed to be suitable for the corresponding LNA, and outputs an appropriate power supply voltage and an appropriate bias voltage to the LNA. The appropriate LNA coupled by the input-side switch amplifies the received RF signal and outputs the obtained signal.

The output-side switch 350 selects and couples an LNA and a processing circuitry of the radio communication apparatus 3 and outputs the output from the LNA to an appropriate processing circuitry.

As explained above, the power supply circuitry 1 according to this embodiment is included for each LNA which appropriately processes the signal selected from various frequency bands and having the frequency included in the frequency band (for example, having a band of about 10 MHz) in the radio communication apparatus 3.

Figure 5:
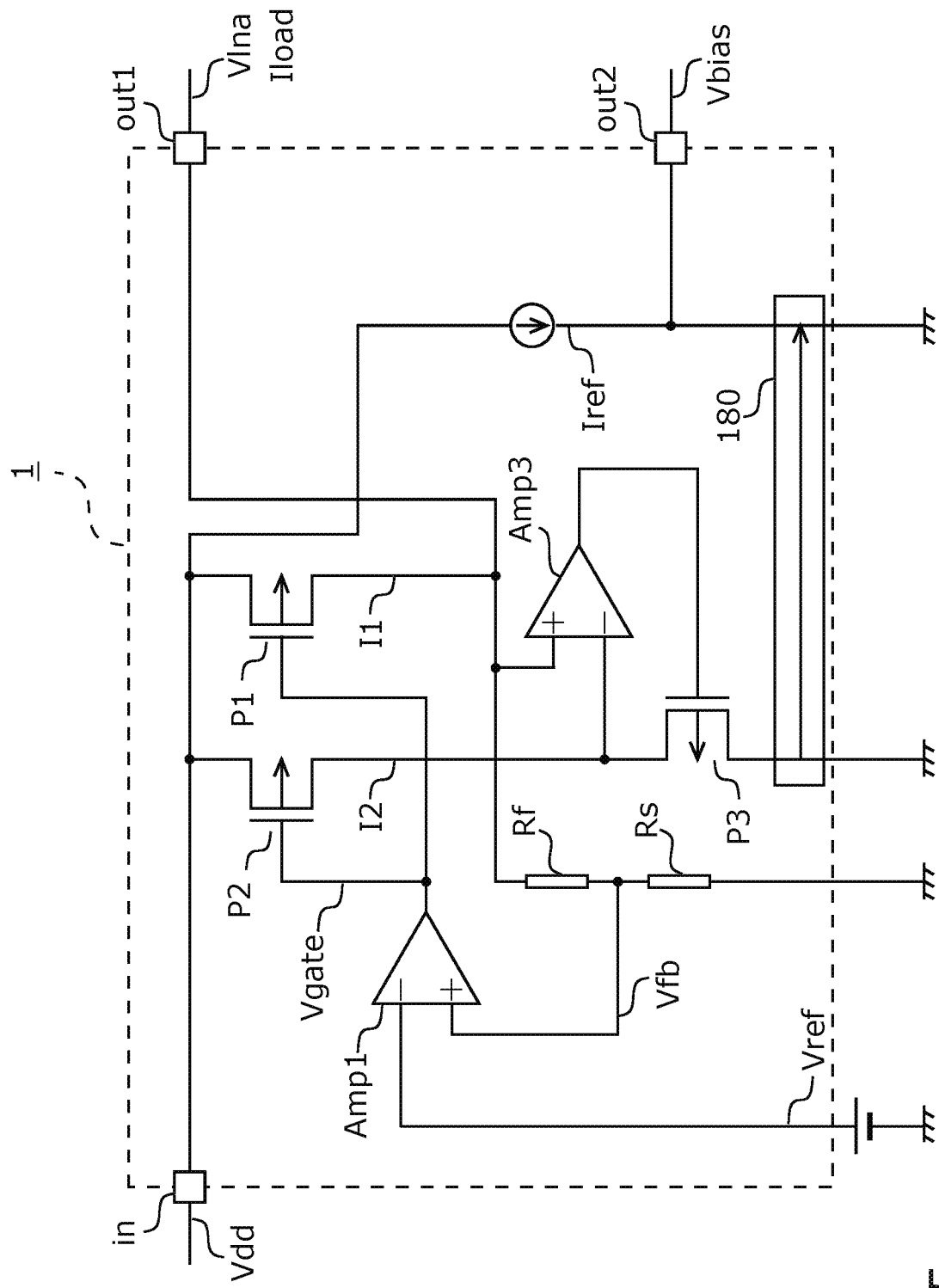
FIG. 5 is a circuitry diagram relating to an example of the power supply circuitry according to an embodiment.

FIG. 5 illustrates a circuitry diagram according to another embodiment of the power supply circuitry 1. The fifth circuitry 18 includes a third amplifier circuitry Amp3, a third transistor P3, and a current mirror 180, unlike the above embodiment. In FIG. 5, a reference current source is included in the power supply circuitry 1 but, not limited to this, the reference current source may be provided outside the power supply circuitry 1, in which case a terminal for inputting the reference current source may be provided in the power supply circuitry 1.

The third amplifier Amp3 is provided in place of the above-explained second amplifier Amp2, and has a non-inverting terminal coupled to the drain of the first transistor P1 and an inverting terminal coupled to the drain of the second transistor P2. The third amplifier Amp3 amplifies a difference between the voltage of the drain of the first transistor P1, namely, the output voltage and the voltage of the drain of the second transistor P2, and outputs the obtained voltage.

The third transistor P3 is, for example, a p-type MOSFET and has a gate coupled to the output of the third amplifier Amp3, a source coupled to the drain of the second transistor P2, and a drain grounded via the current mirror 180. When the voltage output from the third amplifier Amp3 is below a threshold voltage, the third transistor P3 is turned on to allow a current to flow from the source to the drain.

The current mirror 180 is provided between the drain of the third transistor P3 and a ground point, and between the reference current source and the output terminal out2, and, a ground point. The current mirror 180 mirrors the current output from the drain of the third transistor P3 at a predetermined ratio to the reference current side. In other words, with an increase in the drain current of the third transistor P3, the current flowing from the reference current Iref to the ground point increases to decrease the bias voltage Vbias output from the output terminal out2.

By providing the fifth circuitry 18, when the load current increases, the output voltage of the third amplifier Amp3 decreases. When the output voltage of the third amplifier Amp3 decreases, the drain current of the third transistor P3 increases. When the drain current of the third transistor P3 increases, the current flowing from the output terminal out2 side via the current mirror 180 to the ground point increases to decrease the potential of the output terminal out2, namely, the bias voltage Vbias.

On the other hand, when the load current decreases, the output voltage of the third amplifier Amp3 increases. When the output voltage of the third amplifier Amp3 increases, the drain current of the third transistor P3 decreases. When the drain current of the third transistor P3 decreases, the current flowing from the output terminal out2 side via the current mirror 180 to the ground point decreases to increase the potential of the output terminal out2, namely, the bias voltage Vbias.

As explained above, according to the increase and decrease in the power supply voltage Vlna by the external load, the bias voltage Vbias also increases and decreases. As a result of this, it becomes possible to offer the same effect as that in the above embodiment also in the power supply circuitry 1 relating to FIG. 5.

Figure 6:
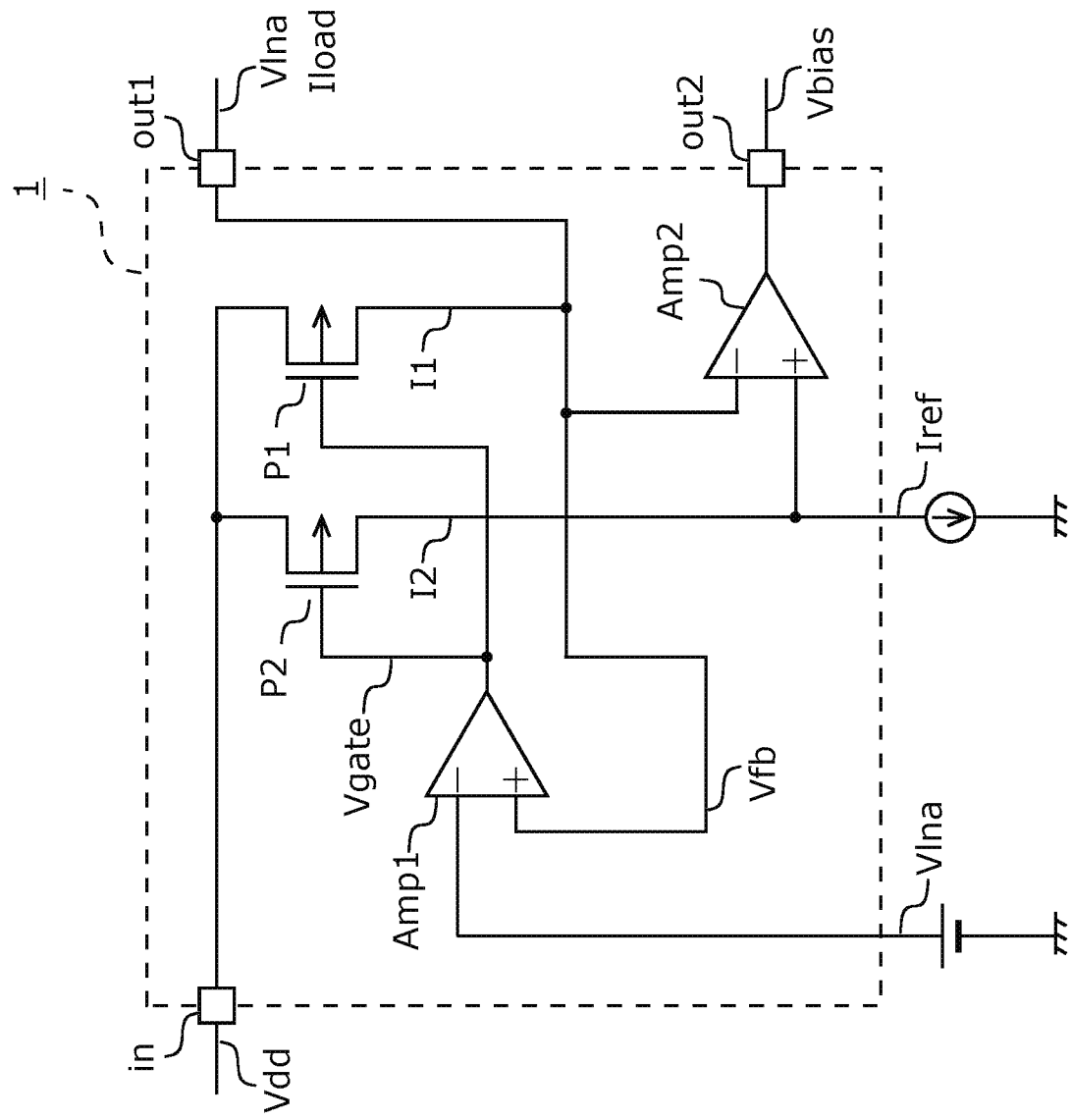
FIG. 6 is a circuitry diagram relating to an example of the power supply circuitry according to an embodiment.

FIG. 6 is a circuitry diagram illustrating still another example of the power supply circuitry 1. In the power supply circuitry 1, it is also possible to make the reference voltage Vref the same voltage as the power supply voltage Vna. In this case, it is also possible to omit the third circuitry 14 as illustrated in FIG. 6. In place of the third circuitry 14, wiring coupling the drain of the first transistor P1 and the non-inverting terminal of the first amplifier Amp1 is provided. The above coupling makes it possible to feed back the potential of the drain of the first transistor P1 as it is to the first amplifier Amp1.

The third circuitry 14 may be omitted by making the reference voltage Vref the same voltage as the power supply voltage Vlna as explained above. In this case, the fifth circuitry 18 may be made the fifth circuitry illustrated in FIG. 5.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in all of the above-explained embodiments, the n-type MOSFET may be a p-type MOSFET according to the situation and the p-type MOSFET may be an n-type MOSFET according to the situation. Further, as the MOSFET, another transistor having the same function, for example, the one which functions as a switching element by voltage, current, or another external switching signal, such as a bipolar transistor may be used. For example, in the case of using the bipolar transistor, the gate, the source, and the drain in the explanation in this specification and in claims may be replaced with an appropriate combination of a base, a collector (emitter), and an emitter (collector), respectively. In any replacement, the physical amount used for switching, such as the magnitude of the voltage to be applied to the gate, the current to be supplied to the base or the like can be replaced as necessary so as to appropriately perform the equivalent operation as the one having the above-explained functions by the characteristics of the elements.

The invention claimed is:

1. A power supply circuitry comprising:
   a first circuitry configured to output a first current based on a drive signal;
   a second circuitry configured to output a second current according to the first current;
   a fourth circuitry configured to generate the drive signal based on a first voltage according to the first current; and
   a fifth circuitry configured to output a second voltage based on the first current and on the second current.

2. The power supply circuitry according to claim 1, wherein:
   the first circuitry comprises a first transistor; and
   the second circuitry comprises a second transistor forming a current mirror with the first transistor.

3. The power supply circuitry according to claim 1, wherein
   the fourth circuitry comprises a first differential amplifier configured to amplify a difference between the first voltage and a reference voltage.

4. The power supply circuitry according to claim 1, wherein
   the fifth circuitry comprises a second differential amplifier configured to compare a voltage based on the second current and on a reference current with the first voltage and output the second voltage.

5. The power supply circuitry according to claim 1, further comprising
a third circuitry configured to generate a feedback voltage based on the first voltage, wherein
the fourth circuitry generates the drive signal based on the feedback voltage.

6. The power supply circuitry according to claim 5, wherein
the third circuitry comprises a resistance coupled between a terminal to which the first voltage is applied and a reference potential, and outputs the feedback voltage from a terminal which is obtained by dividing the resistance by a predetermined ratio.

7. The power supply circuitry according to claim 5, wherein
the fourth circuitry comprises a first differential amplifier configured to amplify a difference between the feedback voltage and a reference voltage.

8. The power supply circuitry according to claim 5, wherein
the fifth circuitry comprises a second differential amplifier configured to compare a voltage based on the second current and on a reference current with the first voltage and output the second voltage.

9. A power supply circuitry comprising:
a first transistor configured to output a first current;
a first differential amplifier coupled to a drive terminal of the first transistor and configured to apply a drive voltage which drives the first transistor, to the first transistor based on a difference between a voltage output from the first transistor and a reference voltage;
a second transistor having a drive terminal coupled to the drive terminal of the first transistor and configured to output a second current proportional to the first current; and
a second differential amplifier coupled to an output of the first transistor and to an output of the second transistor and configured to output a second voltage based on a difference between the output of the first transistor and the output of the second transistor.

10. The power supply circuitry according to claim 9, further comprising
a feedback circuitry coupled to the output of the first transistor and to the first differential amplifier and configured to feed back a first voltage based on the first current to the first differential amplifier.

11. A radio communication apparatus, comprising:
the power supply circuitry according to claim 1; and
an amplifier circuitry configured to use the first voltage as a power supply voltage and use the second voltage as a bias voltage with respect to an input signal, and amplify the input signal and output the amplified signal.

12. The radio communication apparatus according to claim 11, further comprising:
a plurality of antennas configured to receive signals in a plurality of frequency bands, on a frequency band basis; and
a switch corresponding to each of the antennas and configured to select the amplifier circuitry which performs processing among a plurality of the amplifier circuitries, based on a frequency of the signal received by each of the antennas, wherein
the power supply circuitry is provided for each of the amplifier circuitries, and the first voltage and the second voltage are set based on the frequency of the signal amplified by the corresponding amplifier circuitry.

13. The radio communication apparatus according to claim 11, wherein:
the input signal is a high-frequency signal; and
the amplifier circuitry is a high-frequency amplifier circuitry.

14. A radio communication apparatus, comprising:
the power supply circuitry according to claim 5; and
an amplifier circuitry configured to use the first voltage as a power supply voltage and use the second voltage as a bias voltage with respect to an input signal, and amplify the input signal and output the amplified signal.

15. The radio communication apparatus according to claim 14, further comprising:
a plurality of antennas configured to receive signals in a plurality of frequency bands, on a frequency band basis; and
a switch corresponding to each of the antennas and configured to select the amplifier circuitry which performs processing among a plurality of the amplifier circuitries, based on a frequency of the signal received by each of the antennas, wherein
the power supply circuitry is provided for each of the amplifier circuitries, and the first voltage and the second voltage are set based on the frequency of the signal amplified by the corresponding amplifier circuitry.

16. The radio communication apparatus according to claim 14, wherein:
the input signal is a high-frequency signal; and
the amplifier circuitry is a high-frequency amplifier circuitry.

17. A radio communication apparatus, comprising:
the power supply circuitry according to claim 9; and
an amplifier circuitry configured to use the first voltage as a power supply voltage and use the second voltage as a bias voltage with respect to an input signal, and amplify the input signal and output the amplified signal.

18. A radio communication apparatus, comprising:
the power supply circuitry according to claim 10; and
an amplifier circuitry configured to use the first voltage as a power supply voltage and use the second voltage as a bias voltage with respect to an input signal, and amplify the input signal and output the amplified signal.

* * * * *